United States Patent
Lee

(10) Patent No.: US 7,202,184 B2
(45) Date of Patent: Apr. 10, 2007

(54) METHOD FOR FABRICATING SEMICONDUCTOR DEVICE

(75) Inventor: Jae-Suk Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 298 days.

(21) Appl. No.: 11/003,926

(22) Filed: Dec. 3, 2004

(65) Prior Publication Data

US 2005/0124150 A1 Jun. 9, 2005

(30) Foreign Application Priority Data

Dec. 3, 2003 (KR) .................. 10-2003-0087186

(51) Int. Cl.
*H01L 21/469* (2006.01)

(52) U.S. Cl. .................. 438/769; 438/770

(58) Field of Classification Search ........ 438/769, 438/770, 771, 772, 778, 787, 788, 635
See application file for complete search history.

(56) References Cited

U.S. PATENT DOCUMENTS

| 6,174,800 | B1 | 1/2001 | Jang | |
|---|---|---|---|---|
| 6,495,208 | B1 | 12/2002 | Desu et al. | |
| 6,495,478 | B1 | 12/2002 | Jang | |
| 6,559,030 | B1 * | 5/2003 | Doan et al. | 438/432 |
| 6,649,488 | B2 * | 11/2003 | Lee et al. | 438/424 |
| 2002/0106907 | A1 * | 8/2002 | Chang | 438/787 |

* cited by examiner

*Primary Examiner*—Tuan H. Nguyen
(74) *Attorney, Agent, or Firm*—Andrew D. Fortney

(57) ABSTRACT

The present invention relates to a semiconductor device fabrication method, which includes forming an inter metal dielectric on a semiconductor substrate having wirings and planarizing the inter metal dielectric through a chemical mechanical polishing, wherein the inter metal dielectric is formed by carrying out at least one cycle of depositing polycrystalline silicon, plasma-processing the polycrystalline silicon, and oxidizing the polycrystalline silicon.

7 Claims, 2 Drawing Sheets

METHOD FOR FABRICATING SEMICONDUCTOR DEVICE

BACKGROUND OF THE INVENTION (a) Field of the Invention

The present invention relates to a method for fabricating a semiconductor device.

(b) Description of the Related Art

Typically, in a metal wiring process for electrically connecting upper and lower metal layers and horizontal wirings, inter metal dielectric layer is formed to isolate the neighbor wirings.

Recently, the inter metal dielectric is formed by depositing dielectric material such as oxide on the semiconductor substrate having a plurality of wirings through a high density plasma process.

However, since the width and pitch of the metal wirings become narrower and lower as the device is highly integrated, the inter metal dielectric formation using the conventional HDP process causes to decrease the area for forming the inter metal dielectric and increase the height, i.e. high aspect ration, thereby voids occurs inside the inter metal dielectric. In this case the voids are filled by conductive material so as to shorten the adjacent devices, resulting in malfunction of the devices.

In order to prevent the voids from occurring inside the inter metal dielectric, a bias power is applied onto the semiconductor substrate in vertical direction while depositing the inter metal dielectric. However, the increase of the bias power applied onto the semiconductor substrate causes an antenna effect due to the plasma such that the metal wirings are partially etched out to cause a corner clipping effect of the metal wirings. This decreases the conductivity of the wirings.

Methods of forming the inter metal dielectrics have been disclosed in the U.S. Pat. Nos. 6,495,478, 6,495,208, and 6,174,800, in which a spin on polymer (SOP), an organic polymer layer, an oxide dielectric and an organic polymer are simultaneously deposited, and other inter metal dielectric is formed through a chemical vapor deposition technique.

SUMMARY OF THE INVENTION

The present invention has been made in an effort to solve the above problems, and it is an object of the present invention to provide a method for fabricating a semiconductor device which is capable of uniformly forming the inter metal dielectric onto relatively large areas of high aspect ratio.

In order to solve the problems, the method for fabricating the semiconductor device of the present invention includes forming an inter metal dielectric on a semiconductor substrate having wirings and planarizing the inter metal dielectric through a chemical mechanical polishing, wherein the inter metal dielectric is formed by carrying out at least one cycle of depositing polycrystalline silicon, plasma-processing the polycrystalline silicon, and oxidizing the polycrystalline silicon.

Preferably, the polycrystalline silicon is deposited at a thickness in the range of 100~1000Å through PECVD process.

Preferably, the polycrystalline silicon is formed using $SiCl_2$ or $SiCl_2H_2$ gas as source gas.

Preferably, the polycrystalline silicon is formed at a temperature in the range of 350~450° C. under pressure below 5 mtorr.

Preferably, the plasma-processing is carried out using one of He, Ar and He as plasma gas.

Preferably, the inter metal dielectric is formed 1.5~2.5 times thicker than the wirings.

The plasma processing removes hydrogen and carbon in the polycrystalline silicon.

DETAILED DESCRIPTION OF THE PREFERRED EMBODIMENTS

Figure 1:
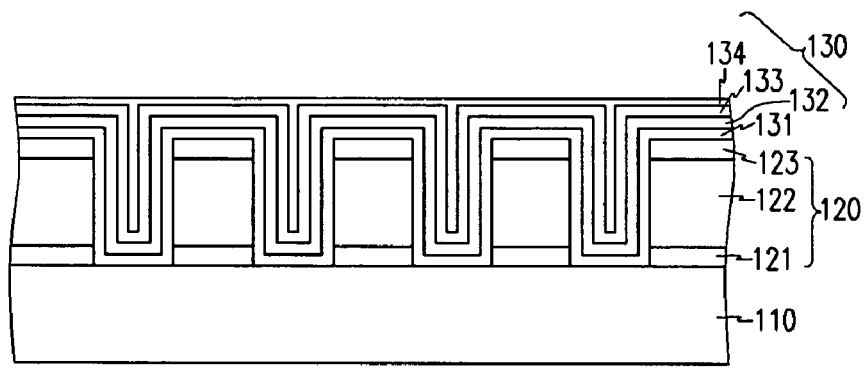
FIG. 1 is a cross sectional view illustrating a semiconductor device according to a preferred embodiment of the present invention.

The details of the present invention will be described hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

A semiconductor device according to a preferred embodiment of the present invention will be described hereinafter with reference to the accompanying drawings in detail.

FIG. 1 is a cross sectional view illustrating a semiconductor device according to a preferred embodiment of the present invention.

As shown in FIG. 1, metal wirings 120 are formed on a semiconductor substrate 110 having lower structure (not shown).

The metal wirings 120 has a structure formed by depositing an adhesion layer 121, a metal layer 122, and an nonreflective layer 123. The adhesion layer 121 is made from Ti/TiN, the metal layer 122 is made from Al, and the nonreflective layer is made of Ti/Tin or TiN.

On the metal wirings 120, the inter metal dielectric 130 is formed so as to isolate the metal wirings 120 from each other.

The inter metal dielectric 130 is formed by sequentially depositing polycrystalline silicon layers 131, 132, 133, and 134.

A method for fabricating the above structured semiconductor device according to the preferred embodiment of the present invention will be described hereinafter with reference to the accompanying drawings in detail.

Figure 2A:
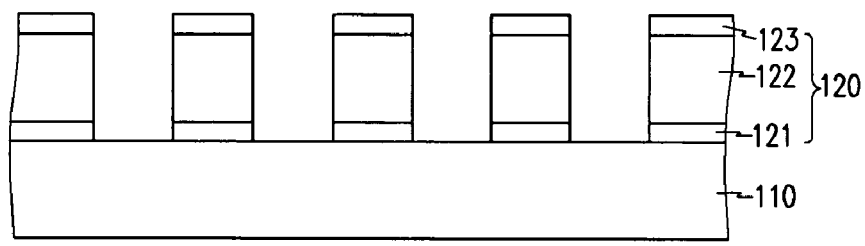
FIG. 2a to FIG. 2c are cross sectional views illustrating fabrication steps of the semiconductor device according to the preferred embodiment of the present invention.
Figure 2B:
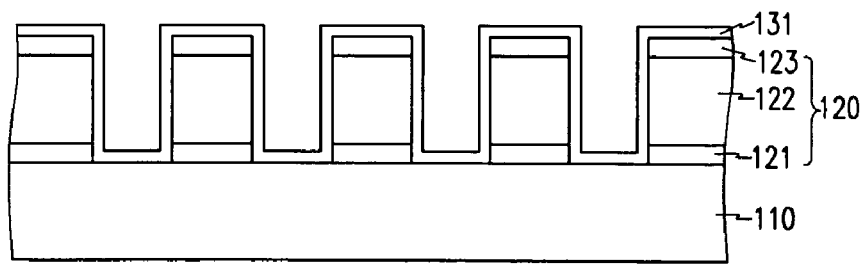
Figure 2C:
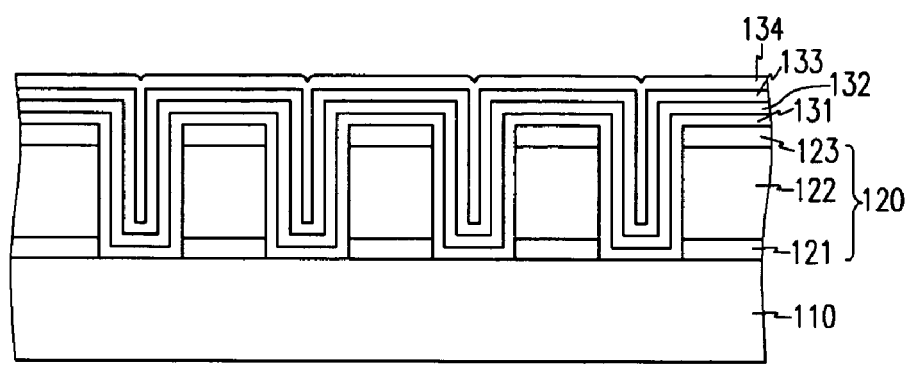

FIG. 2a to FIG. 2c are cross sectional views illustrating fabrication steps of the semiconductor device according to the preferred embodiment of the present invention.

As shown in FIG. 2a, an adhesion layer 121 is deposited on the semiconductor substrate 110 having a predetermined lower structure (not shown) and then a metal layer 122 is formed out of Al on the adhesion layer 121. The adhesion layer 121 is deposited by sputtering Ti/TiN at a thickness in the range of 100~700Å, and the metal layer 122 is deposited by sputtering aluminum at a thickness in the range of 6000~7000Å. However, since the aluminum has high reflectivity it is impossible to operate masking with the aluminum during a photolithography process.

Accordingly, the metal wirings 120 are formed in such a way of depositing the Ti/TiN or Tin, as a non-reflection layer 123 on the metal layer 122 at a thickness in the range of 400~700Å using the sputtering technique and then selectively etching the non-reflection layer 123, the metal layer 122, and the adhesion layer in sequential order, thereby the metal wirings have the structure layered with the adhesion layer 121, the metal layer 122, and the non-reflection layer 123.

As shown in FIG. 2b, a first polycrystalline silicon layer 131 is formed on the metal wirings 120.

The first polysilicon layer 131 is formed by depositing polycrystalline silicon (not shown) on the metal wirings 120 through a plasma enhanced chemical vapor deposition (PECVD). The polycrystalline silicon is deposited at a thickness in the range of 100~1000Å using $SiH_4$ or $SiCl_2H_2$ gas as the source gas. Also, the polycrystalline silicon deposition is carried out at a temperature in the range of 350~450° C. under pressure below 5 mtorr. The polycrystalline silicon is plasma-processed so as to remove the hydrogen (H) and carbon (C). The plasma process is carried out with any of He, Ar, and Ne gas as the plasma gas. After removing the hydrogen and carbon the polycrystalline silicon is oxidized using $N_2O$ or $O_2$ gas.

As shown in FIG. 2c, a second, a third, and a fourth polysilicon layers 132, 133, and 134 are sequentially deposited until the spaces between the adjacent metal wirings are completely filled so as to form an inter metal dielectric 130 having plural polysilicon layer 131, 132, 133, and 134. Each of the second, third, and fourth polysilicon layers 132, 133, and 134 are formed in the same manner for forming the first polysilicon layer 131. In this embodiment the polysilicon layer is formed with four polysilicon layers 131, 132, 133, and 134, however the number of polysilicon layers can be changed according to the pitches of and widths between the metal wirings.

In case of forming the inter metal dielectric 130 by repeatedly depositing multiple thin layers unlike the conventional one which is formed thickly at a time, the stepped coating degree is improved even when the aspect ratio of the adjacent wirings is great.

Sequentially, as shown in FIG. 1, the inter metal dielectric 130 is planarized using the chemical mechanical polishing technique until the thickness of the inter metal dielectric becomes 1.5~2.5 times thicker than the wirings.

Although preferred embodiments of the present invention have been described in detail hereinabove, it should be clearly understood that many variations and/or modifications of the basic inventive concepts herein taught with may appear to those skilled in the present art will still fall within the sprit and scope of the present invention, as defined in the appended claims.

As described above, in the present invention the inter metal dielectric for isolating the wirings from each other is uniformly formed such that it is possible to highly integrate the devices even with fine linewidth and spaces between the wirings.

Also, the adjacent wirings can be securely isolated from each other in the present invention such that it is possible to improve the device characteristic and stabilize the operation.

What is claimed is:

1. A method for fabricating a semiconductor device, comprising:
    forming an inter metal dielectric on a semiconductor substrate having wirings; and
    planarizing the inter metal dielectric through a chemical mechanical polishing,
    wherein the inter metal dielectric is formed by carrying out at least one cycle of depositing polycrystalline silicon, plasma-processing the polycrystalline silicon, and oxidizing the polycrystalline silicon.

2. The method of claim 1, wherein the polycrystalline silicon is deposited at a thickness in the range of 100~1000Å through PECVD process.

3. The method of claim 2, wherein the polycrystalline silicon is formed at a temperature in the range of 350~450° C. under pressure below 5 mtorr.

4. The method of claim 1, wherein the polycrystalline silicon is formed using $SiCl_2$ or $SiCl_2H_2$ gas as source gas.

5. The method of claim 1, wherein the plasma-processing is carried out using one of He, Ar and He as plasma gas.

6. The method of claim 1, wherein the inter metal dielectric is formed 1.5~2.5 times thicker than the wirings.

7. The method of claim 1, wherein the plasma processing removes hydrogen and carbon in the polycrystalline silicon.

\* \* \* \* \*